Dec. 15, 1970 H. R. CAMENZIND 3,548,329

TWO-STATE AMPLIFIER

Original Filed Jan. 10, 1966

INVENTOR
HANS R. CAMENZIND
BY Robert [signature]
ATTORNEY

United States Patent Office 3,548,329

Patented Dec. 15, 1970

3,548,329

TWO-STATE AMPLIFIER

Hans R. Camenzind, Lexington, Mass., assignor to P. R. Mallory & Co. Inc., Indianapolis, Ind., a corporation of Delaware Continuation of application Ser. No. 519,689, Jan. 10, 1966. This application May 9, 1969, Ser. No. 835,857

Int. Cl. H03f *1/04, 3/20*

U.S. Cl. 330—10 3 Claims

ABSTRACT OF THE DISCLOSURE

A two-state amplifier for providing a pulse width modulated output signal substantially linearly related to the signal level of an input signal applied to the amplifier.

This is a continuation of Ser. No. 519,689, filed Jan. 10, 1966, now abandoned, May 11, 1969.

The present invention relates to two-state amplifiers and more particularly to the means and method for providing a novel and practical switching network for two-state amplifiers.

Two-state amplifiers, sometimes referred to as pulse-width modulated amplifiers or class-D amplifiers, are normally used in lieu of class A and class B amplifiers when high efficiency is required. That is, instead of using transistors as variable resistors, as is the case with class A and class B amplifiers, transistors are used as switches in two-state amplifiers. The load is switched between a positive and negative voltage at a very rapid rate. If the load is inductive and is connected to the positive and the negative supply for equal periods of time, no appreciable current will flow into the load. If, however, the two times are not equal, an average current does flow. When the ratio of the two times is proportional to the input signal, high efficiency amplification can be obtained.

One known approach for producing pulse-width modulation compares a triangular waveform with the instantaneous level of the input signal. The output waveform changes polarity whenever these two voltages are equal. The disadvantage of this approach is that an independent triangle waveform generator is required and the comparison of the two voltages is difficult in that it requires careful balancing and extensive wave-shaping.

Another known approach uses a resistor-capacitor feedback over an amplifier with hysteresis. This amplifier operates similar to an astable multivibrator. The signal, which is connected to the input of this amplifier is superimposed on the feedback voltage and thus changes the on-to-off ratio of the output waveform. This amplifier, although it is simple, produces rather large distortions and the carrier frequency is not constant.

Accordingly, there is presented in this specification a switching network for a two-state amplifier which is simple, does not produce distortion, and provides a constant carrier frequency. The pulse-width of the output waveform of the two-state amplifier is linearly related to the input level and, for any input level, the same carrier frequency is obtained.

The two-state amplifier utilizing the switching network of the present invention is ideally suited for fabrication by integrated circuit techniques. The quantity and values of the passive components are sufficiently low to permit such a manufacturing technique to be used.

It is an object of the present invention, therefore, to provide a practical and novel switching network for a two-state amplifier.

It is another object of the present invention to provide a two-state amplifier which can be manufactured by integrated circuit techniques.

It is a further object of the present invention to provide a switching network for a two-state amplifier which will not produce distortion.

It is still another object of the present invention to provide a switching network for a two-state amplifier which will provide a constant carrier frequency for a given input level.

It is a further object of the present invention to provide a two-state amplifier having an output waveform pulse-width which is linearly related to the input level.

The present invention, in another of its aspects, relates to novel features of the instrumentalities described herein for teaching the principal object of the invention and to the novel principles employed in the instrumentalities whether or not these features and principles may be used in the said object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which.

Generally speaking, the present invention is a switching network for a two-state amplifier of the type having an input means, an output means, and a direct current power source connected thereto, said switching network comprising: a first transistor having an emitter, base, and collector electrodes, said base electrode being connected directly to said input means so as to provide a voltage level across said transistor determined by the input signal level to said input means, said collector electrode being connected to one side of said power source, and said emitter being connected through a resistor to the other side of said power source; a second transistor having an emitter, base, and collector electrodes; a third transistor having an emitter, base, and collector electrodes; first circuit means for connecting said emitter electrode of said first transistor to said emitter electrodes of said second and third transistors; and a capacitor connected between said output means and said base electrodes of said second and third transistors, said capacitor being charged and discharged in response to the polarity change of said output means so as to switch said second and third transistors, thereby switching the output of said two-state amplifier at a predetermined rapid rate.

Figure 1:
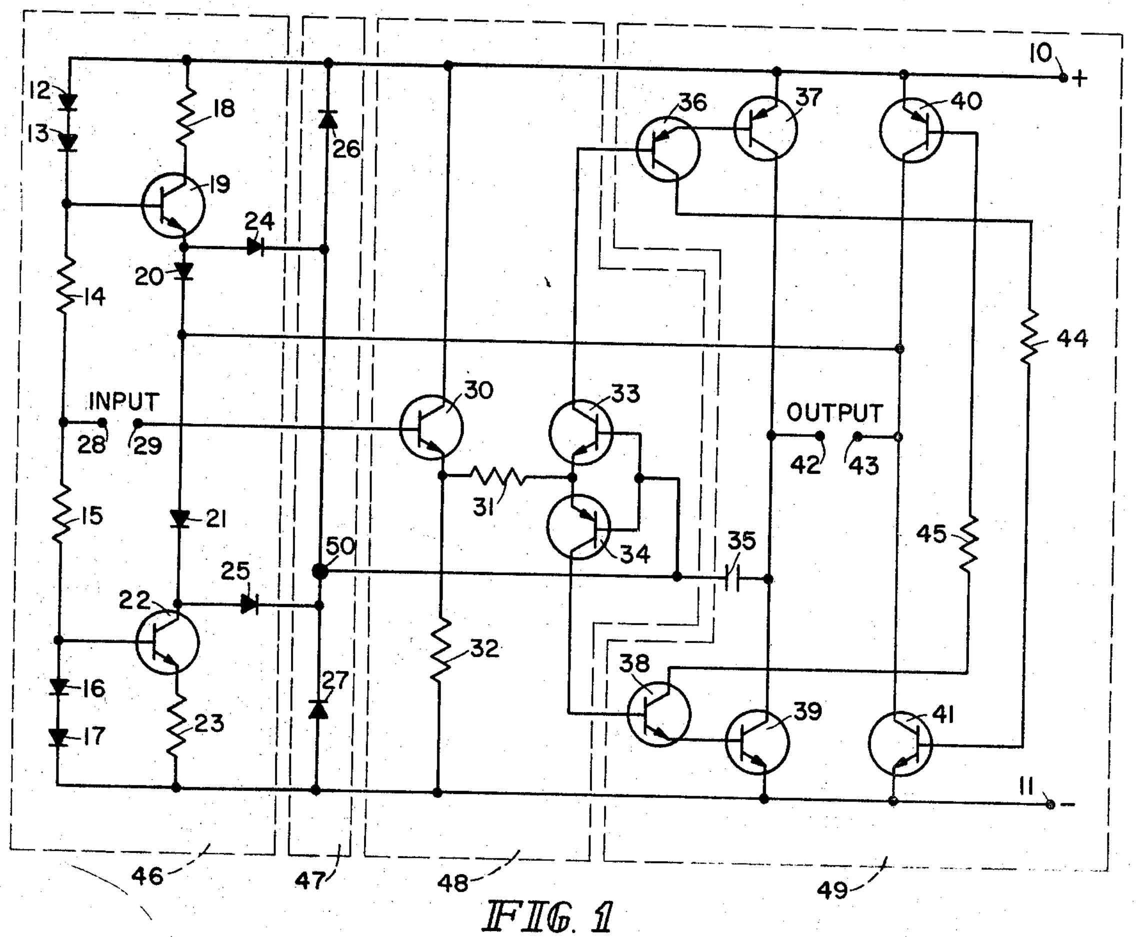
FIG. 1 is a schematic of a two-state amplifier incorporating the switching network of the present invention.

Referring now to the drawing, and particularly to the schematic of FIG. 1, the component parts of the present invention can be visualized in conjunction with the following description.

The positive terminal of a power source is connected to the terminal 10. The terminal 11 is connected to ground. A divider network consisting of diodes 12, 13, 16 and 17 and resistors 14 and 15 are coupled across the terminals 10 and 11. A resistor 18 is connected from the positive terminal 10 and the collector of the transistor 19. The emitter of the transistor 19 is connected to the anode of the diode 20 and the anode of the diode 24. The base of the transistor 19 is connected to a junction between the diode 13 and the resistor 14. The cathode of the diode 20 is coupled to the anode of the diode 21. The cathode of the diode 21 is connected to the collector of the transistor 22 and to the anode of the diode 25. The emitter of the transistor 22 is connected to the resistor 23 and through said resistor to the ground terminal 11. The base of the transistor 22 is connected to a junction between the resistor 15 and the diode 16. The diodes 26 and 27 are coupled in series across the terminals 10 and 11. The anode of the diode 27 is connected to the terminal 11 and the cathode of the diode 26 is connected to the terminal 10. The cathode of the diode 24 is coupled to the anode of the diode 26 and the cathode of the diode 25 is coupled to the cathode of the diode 27.

The collector of the transistor 30 of the switching network is coupled directly to the positive terminal 10. The emitter of said transistor 30 is coupled to the resistor 32 and through said resistor to the ground terminal 11. The base of said transistor 30 is connected to the input terminal 29. The second input terminal is terminal 28, which is connected to the junction between the resistors 14 and 15. The emitter of the transistor 30 is connected to the resistor 31 and through said resistor to the emitter of the transistor 33 and the emitter of the transistor 34. The bases of the transistors 33 and 34 are directly connected and are connected to a first side of the capacitor 35 and to the junction between the diodes 26 and 27.

The collector of the transistor 33 is connected to the base of the transistor 36 and the collector of the transistor 34 is connected to the base of the transistor 38. The emitter of the transistor 36 is connected to the base of the transistor 37. The emitter of the transistor 37 is connected to the positive terminal 10 and the collector of the transistor 37 is connected to the output terminal 42 and to the collector of the transistor 39. The collector of the transistor 36 is connected to the resistor 44 and through said resistor to the base of the transistor 41. The emitters of the transistors 39 and 41 are connected to the ground terminal 11. The emitter of the transistor 38 is connected to the base of the transistor 39 and the collector of the transistor 38 is connected to the resistor 45 and through said resistor to the base of the transistor 40. The collectors of the transistors 40 and 41 are connected to the output terminal 43. The second side of the capacitor 35 is connected directly to the output terminal 42 and, consequently, to the collectors of the transistors 37 and 39.

As shown in FIG. 1, the two-state amplifier is comprised of a constant current circuit 46, a clamping circuit 47, a signal level switching network 48, and an output stage 49. It is to be noted that the two-state amplifier shown in FIG. 1 is one of the many possible circuits which can use the switching network of the present invention.

With the above description of components and circuits in mind, and by making reference to FIG. 1, the following analysis of operation will serve to convey the functional details of the present invention. The capacitor 35 leads from the output terminal 42 to the junction point 50 and is either charged or discharged through the transistors 19 or 22. The transistors 19 and 22 are connected in the well-known constant current configuration and are gated on and off through the diode matrix consisting of the diodes 20, 21, 24 and 25.

As the output rises towards the positive potential, the voltage at the junction 50 increases in the positive direction and is clamped by the diode 26. Since the transistor 22 is gated on, the capacitor 35 discharges at a constant rate. When the voltage on the capacitor 35 reaches a level set by the input signal through the transistor 30, the transistor 33 turns off and the transistor 34 turns on. With the switching of the two transistors 33 and 34, the polarity of the output signal changes, the voltage at the junction 50 reduces to ground potential, the transistor 19 is gated on, and the voltage at the junction 50 starts increasing.

The level at which the output signal polarity changes is, therefore, set by the level of the input signal at the base of the transistor 30.

Figure 2:
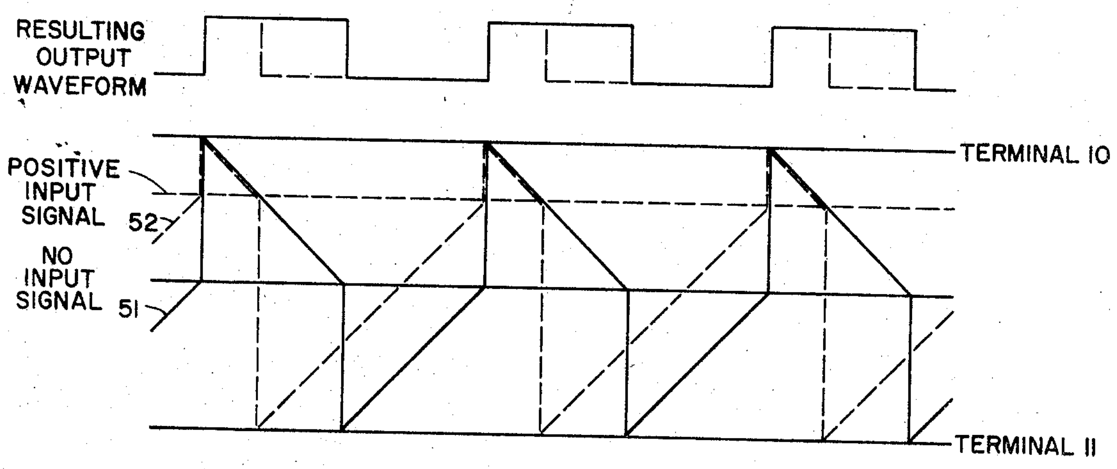
FIG. 2 is an illustration of the waveforms for the two-state amplifier of the present invention.

Referring now to FIG. 2, the waveform at the junction 50 and the resulting output waveform for two different input levels can be seen. The waveform at the junction 50 with no input signal is the solid line 51. The waveform at the junction 50 with a positive input signal is the dashed line 52. The balance of the waveforms and reference levels are defined in the illustration of FIG. 2.

It can be seen in FIG. 2 that the pulse-width of the output signal is linearly related to the input signal level and, for any input level, the same carrier frequency is obtained. No special precautions are necessary to get a 50% duty cycle without an input signal.

An interesting feature of the circuit shown in FIG. 1 is that instead of changing the switching level with the input signal, the switching level can be held constant and the clamping level can be changed to produce the same effect.

The switching network of the present invention, as hereinbefore described in one of its embodiments, is merely illustrative and not exhaustive in scope. Since many widely different embodiments of the invention may be made without departing from the scope thereof, it is intended that all matter contained in the above description and shown in the accompanying drawing shall be interposed as illustrative and not in a limiting sense.

What is claimed is:

1. In a two-state amplifier including a constant current circuit, a clamping circuit, a signal level switching circuit, and a two-state output circuit including first and second means providing said states, said signal level switching circuit comprising:

(a) a first transistor including a base connected to said constant current circuit, a collector connected to the plus side of a power source, and an emitter connected to emitters of second and third transistors and to ground, (b) the collectors of said second and third transistors individually connected to said first and second means of said two-state output circuit and the bases of said second and third transistor connected to each other and to said clamping circuit and said two-state output circuit.

2. In a two-state amplifier according to claim 1 wherein said two-state output circuit includes a capacitor connected betwen said first and second means of said two-state output circuit, and wherein said capacitor is connected to said bases of said second and third transistors in shunt relationship with said clamping circuit.

3. In a two-state amplifier according to claim 2, wherein said first means of said two-state output circuit includes a first transistor connected to the collector of said second transistor of said switching circuit and said power source and output terminal means, and a second transistor connected to said output terminal means and ground; and wherein said second means of said two-state output circuit includes a first transistor connected to the collector of said third transistor of said switching current and ground and said output terminal means, and a second transistor connected to said output terminal means and said source of power, said switching circuit alternately switching between said first and said second means whereby said first and said second states are provided.

References Cited

UNITED STATES PATENTS

| | | | |
|---|---|---|---|
| 3,070,656 | 12/1962 | Wiencek | 330—14X |
| 3,281,703 | 10/1966 | Bladen | 330—13 |

OTHER REFERENCES

Radio Electronics Articles—"The Two State Amplifiers," July 1965—pp. 54–56 and August 1965, pp. 35–38, Crowhurst."

NATHAN KAUFMAN, Primary Examiner

U.S. Cl. X.R.

330—24, 20, 17, 18, 14; 307—244